United States Patent
Parker et al.

(10) Patent No.: US 10,983,184 B2
(45) Date of Patent: Apr. 20, 2021

(54) SPECIALIZED DIAMOND MATERIALS FOR NMR APPLICATIONS

(71) Applicant: The Regents of the University of California, Oakland, CA (US)

(72) Inventors: Anna Parker, Berkeley, CA (US); Jonathan King, Berkeley, CA (US); Christophoros Vassiliou, El Cerrito, CA (US); Alexander Pines, Berkeley, CA (US); Claudia Avalos, Lausanne (CH); Birgit Hausmann, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 365 days.

(21) Appl. No.: 15/850,392

(22) Filed: Dec. 21, 2017

(65) Prior Publication Data
US 2018/0180689 A1 Jun. 28, 2018

Related U.S. Application Data

(60) Provisional application No. 62/438,129, filed on Dec. 22, 2016.

(51) Int. Cl.
*G01R 33/28* (2006.01)
*G01R 33/44* (2006.01)
(Continued)

(52) U.S. Cl.
CPC .......... *G01R 33/282* (2013.01); *C01B 32/25* (2017.08); *G01N 24/08* (2013.01); *G01R 33/446* (2013.01);
(Continued)

(58) Field of Classification Search
CPC ............... G01R 33/282; G01R 33/446; G01R 33/4608; G01R 33/62; C01B 32/25;
(Continued)

(56) References Cited

U.S. PATENT DOCUMENTS

2001/0043903 A1* 11/2001 D'Evelyn ............... C01B 32/25
423/446
2014/0061510 A1* 3/2014 Twitchen ................ C30B 29/04
250/492.1
(Continued)

*Primary Examiner* — Akm Zakaria
(74) *Attorney, Agent, or Firm* — Knobbe Martens Olson & Bear LLP

(57) ABSTRACT

Polarizable diamond materials and methods for obtaining nuclear magnetic resonance spectra of samples external to the diamond materials are described. The diamond materials can include $^{12}C$, $^{13}C$, substitutional nitrogen, and nitrogen vacancy defects in a crystalline lattice, wherein the substitutional nitrogen concentration is between 10 ppm and 200 ppm, the nitrogen vacancy concentration is between 10 ppb and 10 ppm, and the $^{13}C$ concentration is greater than 1.1% and not more than 25%. Methods for obtaining nuclear magnetic resonance spectra can include optically pumping a diamond material to generate electron spin hyperpolarization in nitrogen vacancy centers, transferring the electron spin hyperpolarization to nuclei of the sample, and generating a nuclear magnetic resonance spectrum by applying a magnetic field to the sample, exciting the sample with a radio frequency pulse, and detecting a nuclear magnetic resonance response from the sample.

7 Claims, 6 Drawing Sheets

(51) Int. Cl.
*C01B 32/25* (2017.01)
*G01N 24/08* (2006.01)
G01R 33/46 (2006.01)
B81C 1/00 (2006.01)
G01R 33/62 (2006.01)
G01N 24/12 (2006.01)

(52) U.S. Cl.
CPC ....... *B81C 1/00111* (2013.01); *B81C 1/00706* (2013.01); *C01P 2002/60* (2013.01); *C01P 2004/61* (2013.01); *C01P 2004/62* (2013.01); *C01P 2004/64* (2013.01); *C01P 2006/20* (2013.01); *C01P 2006/88* (2013.01); *G01N 24/12* (2013.01); *G01R 33/4608* (2013.01); *G01R 33/62* (2013.01)

(58) Field of Classification Search
CPC ..... G01N 24/08; G01N 24/12; C01P 2002/60; C01P 2004/62; C01P 2004/64; C01P 2006/20; C01P 2006/88; C01P 2004/61; B81C 1/00706; B81C 1/00111
See application file for complete search history.

(56) References Cited

U.S. PATENT DOCUMENTS

| | | | | |
|---|---|---|---|---|
| 2014/0306707 A1* | 10/2014 | Walsworth | ......... | G01R 33/1284 324/309 |
| 2016/0130725 A1* | 5/2016 | Xu | ......................... | C01B 32/25 428/64.1 |

* cited by examiner

SPECIALIZED DIAMOND MATERIALS FOR NMR APPLICATIONS

RELATED APPLICATIONS

This application claims the benefit of U.S. Provisional Application No. 62/438,129, filed Dec. 22, 2016, entitled "SPECIALIZED DIAMOND MATERIALS FOR NMR APPLICATIONS," which is incorporated herein by reference in its entirety.

STATEMENT REGARDING FEDERALLY SPONSORED R&D

The inventions described and claimed herein were made with government support under Contract No. DE-AC02-05CH11231 awarded by the U.S. Department of Energy. The government has certain rights in this invention.

TECHNICAL FIELD

This disclosure relates generally to the field of magnetic resonance spectroscopy, and more specifically to materials and methods for signal enhancement in nuclear magnetic resonance spectroscopy.

BACKGROUND

Nuclear magnetic resonance (NMR) spectroscopy is a highly useful tool in science and industry. Because the signal detected in NMR spectroscopy is inherently weak, very large and expensive tools are frequently required to obtain useful information about a sample of interest. Existing methods of enhancing NMR signals have included the use of superconducting magnets, cryogenic techniques, and radical dopants, all of which have technical limitations that increase the complexity and/or difficulty of obtaining reliable NMR spectra.

SUMMARY

The systems and methods of this disclosure each have several innovative aspects, no single one of which is solely responsible for its desirable attributes. Without limiting the scope as expressed by the claims that follow, its more prominent features will now be discussed briefly.

In one embodiment, a polarizable diamond material for transfer of nuclear spin polarization comprising $^{12}C$, $^{13}C$, substitutional nitrogen, and nitrogen vacancy defects in a crystalline lattice is described. The substitutional nitrogen concentration in the diamond material is between 10 ppm and 200 ppm. The nitrogen vacancy concentration in the diamond material is between 10 ppb and 10 ppm. The $^{13}C$ concentration in the diamond material is greater than 1.1% and not more than 25%.

The material can include a single-crystal diamond structure. The single-crystal diamond structure can include a plurality of microstructures. The material can include a diamond crystallite powder. The diameter of the crystallites can be between 500 nm and 100 μm. The $^{13}C$ concentration in the diamond material can be between 8% and 12%. The nitrogen vacancy concentration in the diamond material can be between 1 ppm and 10 ppm.

In another embodiment, a method of obtaining a nuclear magnetic resonance spectrum of a sample is described. The method includes optically pumping a diamond material to generate electron spin hyperpolarization in nitrogen vacancies within the diamond material, transferring the electron spin hyperpolarization directly or indirectly to nuclei of the sample external to the diamond material, and generating a nuclear magnetic resonance spectrum by applying a magnetic field to the sample, exciting the sample with a radio frequency pulse, and detecting a nuclear magnetic resonance response from the sample. The diamond material has a substitutional nitrogen concentration between 10 ppm and 200 ppm, a nitrogen vacancy concentration between 10 ppb and 10 ppm, and a $^{13}C$ concentration greater than 1.1% and not more than 25%.

The diamond material can be a single crystal having at least a first face, wherein the first face includes a plurality of microstructures. The sample can include a liquid, wherein transferring the electron spin hyperpolarization to nuclei of the sample includes placing the liquid in physical contact with the first face of the diamond material. The $^{13}C$ concentration in the diamond material can be between 8% and 12%. The nitrogen vacancy concentration in the diamond material can be between 1 ppm and 10 ppm.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. Throughout the drawings, similar symbols typically identify similar concepts, unless context dictates otherwise.

FIGS. 4A-4G depict an example process of creating a diamond crystal having an array of pillars for dynamic nuclear polarization transfer.

DETAILED DESCRIPTION

Figure 1:
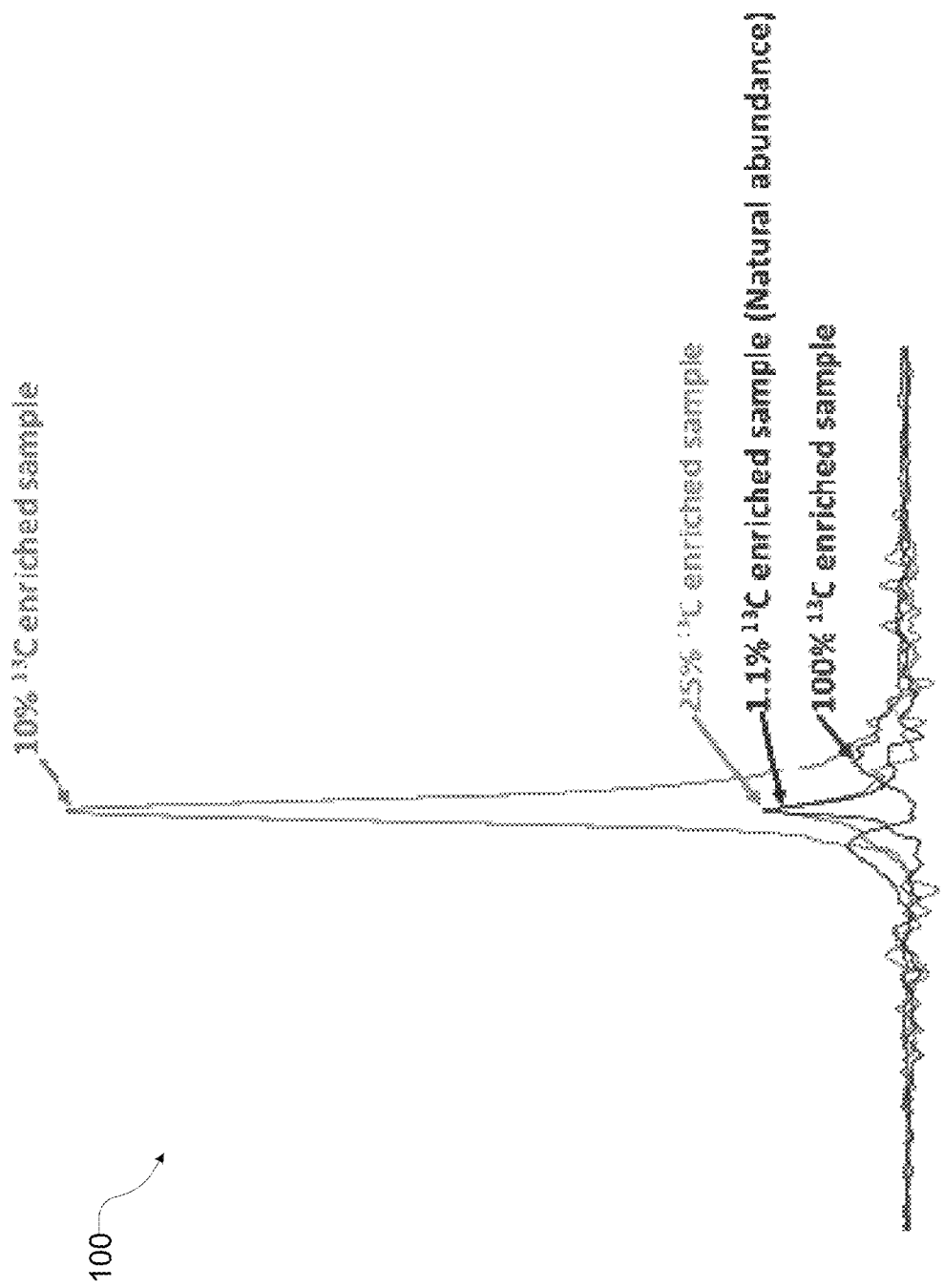
FIG. 1 is a graph depicting observed nuclear magnetic resonance signals of $^{13}C$ enriched diamond materials having $^{13}C$ concentrations of 1.1%, 10%, 25%, and 100%.

The following description is directed to certain implementations for the purpose of describing the innovative aspects of this disclosure. However, a person having ordinary skill in the art will readily recognize that the teachings herein can be applied in a multitude of different ways.

Generally described, the systems, methods, and materials described herein can be implemented for signal enhancement in nuclear magnetic resonance (NMR) spectroscopy. Existing NMR techniques are frequently limited by relatively low magnetization within material samples being analyzed. The magnetization in a sample is proportional to the average polarization of the nuclear spins within the sample. Spin polarization is typically generated by allowing spins to thermally equilibrate in a large magnetic field. However, the polarization of nuclear spins at room temperature is generally less than 0.004%, even in the highest achievable magnetic fields. Non-equilibrium spin polarization may thus be generated within NMR samples to increase the magnetization. One possible source of non-equilibrium spin polarization is the transfer of spin polarization to sample nuclei from electron spins, which typically possess a higher equilibrium polarization, through dynamic nuclear polarization (DNP). However, DNP is still technically difficult to implement because high magnetic fields and cryogenic temperature are required with DNP to approach full polarization. An electron spin that could be hyperpolarized at room temperature would accordingly be desirable to allow DNP at room temperature.

Nitrogen vacancy centers in diamond crystals can be nearly completely polarized by optical pumping at room temperature. Spin polarization from polarized nitrogen vacancy centers may be transferred to nuclei of an NMR sample external to the diamond. The transfer may occur either directly, or indirectly by transferring spin polarization from the nitrogen vacancy centers to nearby $^{13}C$ nuclear spins, and from the $^{13}C$ nuclear spins to external nuclei. Hyperpolarized external nuclei can then be magnetized more than at equilibrium spin polarization, and may accordingly generate an enhanced NMR signal. Various qualities of the diamond materials can affect the degree of hyperpolarization within the diamond and the suitability for transfer of polarization through DNP to external nuclei. In some aspects, the $^{13}C$ concentration, substitutional nitrogen concentration, and nitrogen vacancy center concentration may be varied to improve the functioning of the nitrogen vacancy centers and neighbor $^{13}C$ spins as a hyperpolarized composite spin system giving rise to DNP of more weakly coupled nuclear spins. Advantageously, the transfer of spin polarization from the diamond materials described herein may allow NMR spectra to be obtained using lower magnetic fields, smaller amounts of sample material, or nuclei with lower gyromagnetic ratios than were previously feasible.

Various embodiments provide diamond material having $^{13}C$ atoms, $^{12}C$ atoms, substitutional nitrogen atoms, and nitrogen vacancy centers. In some embodiments, the concentration of $^{13}C$ in the diamond material ranges from 0.5% to 50%, from 1% to 30%, from 1% to 25%, from 5% to 25%, from 5% to 20%, from 8% to 12%, from 20% to 30%, or from 10% to 20%. In some embodiments, the concentration of substitution nitrogen atoms in the diamond material ranges from 1 ppm to 500 ppm, from 5 ppm to 300 ppm, from 10 ppm to 200 ppm, from 30 ppm to 100 ppm, from 100 ppm to 200 ppm, and from 10 ppm to 100 ppm. In some embodiments, the concentration of nitrogen vacancy centers in the diamond material ranges from 1 ppb to 100 ppm, from 10 ppb to 50 ppm, from 80 ppb to 30 ppm, from 100 ppb to 10 ppm, from 200 ppb to 5 ppm, from 500 ppb to 1 ppm, from 100 ppb to 1 ppm, from 100 ppb to 800 ppb, from 1 ppm to 10 ppm, and from 5 ppm to 10 ppm.

Diamond samples for use with the DNP methods described herein may be synthetically produced, such as by chemical vapor deposition, high-pressure high-temperature synthesis, or other diamond synthesis methods. Synthetic production of diamond materials under controlled conditions can allow various properties of a diamond sample to be precisely determined. For example, in a chemical vapor deposition process, a diamond may be formed on a substrate exposed to one or more gases. The gases may include at least one carbon-containing gas, such as methane, and one or more other gases such as hydrogen and nitrogen. Typically, the carbon from the methane gas can be deposited on the substrate or the surface of a diamond sample being grown on the substrate. The hydrogen gas may be broken into atomic hydrogen, which can selectively etch carbon that has not been incorporated into the diamond lattice from the surface of the growing diamond.

Nitrogen gas, if present as one of the feed gases, may provide nitrogen atoms which may also be deposited with the carbon atoms of the crystal lattice and thereby can be included in the diamond sample as substitutional nitrogen within the crystalline structure of the diamond. Some of the substitutional nitrogen atoms can additionally form nitrogen vacancy centers when disposed adjacent to a lattice vacancy. Where nitrogen vacancy centers are desired in a synthetic diamond sample, the relative concentration of the nitrogen gas relative to the methane and hydrogen gases may be tuned to produce a desired concentration of substitutional nitrogen and nitrogen vacancy centers within the finished sample. For example, tuning of the nitrogen gas concentration may yield a sample with a substitutional nitrogen concentration of between 10 ppm and 200 ppm, between 1 ppm, and 300 ppm, or the like. The nitrogen vacancy concentration is typically less than the substitutional nitrogen concentration, for example, between 1 ppb and 10 ppm for a substitutional nitrogen concentration between 10 ppm and 200 ppm.

Similarly, the carbon-containing gas may include two or more different carbon-containing gases. For example, if a synthetic diamond sample is to include both $^{12}C$ and $^{13}C$, the carbon-containing gas may include a combination of $^{12}C$ methane and $^{13}C$ methane. In some implementations the relative concentrations of $^{12}C$ and $^{13}C$ in the synthetic diamond can be similar or equal to the respective concentrations of $^{12}C$ methane and $^{13}C$ methane in the feed gas. Similar to the concentration of nitrogen, the concentrations of $^{12}C$ methane and $^{13}C$ methane may be tuned so as to produce a desired concentration of $^{13}C$ within the finished sample. For example, in various examples $^{13}C$ may comprise between 8% and 12% of the total carbon in the finished diamond sample, or any other desired portion, such as between 20% and 30%, between 5% and 25%, as low as 1.1% or as high as 100% of the carbon in the diamond.

After such a synthetic diamond sample has been produced, the nitrogen vacancy centers within the sample may be utilized for dynamic nuclear polarization of surrounding $^{13}C$ nuclei within the crystal lattice as well as atomic nuclei of other materials outside the diamond sample, such as for improvement of NMR methods as described herein. In general, the transfer of polarization through DNP is dependent on proximity between the source of polarization and the nuclei to be polarized. Thus, DNP with the diamond samples described herein can occur when the polarized nitrogen vacancy centers and $^{13}C$ nuclei are in relatively close proximity to nuclei of the external sample of interest. The external sample may advantageously be a liquid sample, allowing most of the atoms in the external sample to pass close to the surface of the diamond sample to enable DNP. Transfer of polarization may further be facilitated by enhancing the surface of the diamond, such as by etching or otherwise creating a textured or shaped surface having a greater surface area than a flat surface. If the diamond materials described herein are to be used to transfer polarization to a solid material, a powder of diamond nanocrystals may be packed onto the surface of the solid material to achieve a suitable proximity between the polarized diamond sample and the external material.

It has been discovered that the $^{13}C$ concentration within a diamond sample may have a significant effect on the effectiveness of the diamond for DNP methods as described herein. FIG. 1 is a graph 100 depicting observed nuclear magnetic resonance signals of $^{13}C$ enriched diamond materials having $^{13}$C concentrations of 1.1%, 10%, 25%, and 100%. $^{13}$C enriched diamonds were prepared using chemical vapor deposition with a combination of $^{13}$C enriched methane and nitrogen gases. The concentration of $^{13}$C within the methane source gas and the relative concentrations of methane and nitrogen was varied to achieve a desired $^{13}$C concentration, substitutional nitrogen concentration, and/or nitrogen vacancy center concentration within the grown diamonds. The samples were exposed to electron irradiation at 1 MeV and annealed at 800° C. for 2 hours to yield an ensemble of nitrogen vacancy centers. Each sample was mounted on a goniometer inside an electromagnet and had a (111) axis aligned with the magnetic field. With the field set to approximately 420 mT, ODMR and DNP were performed using a microwave loop near the sample. The nuclear polarization was monitored based on the magnitude of an NMR signal acquired using a spectrometer and a 50-turn planar coil probe tuned to approximately 4.5 MHz. As shown in the graph 100 of FIG. 1, NMR spectra (indicative of $^{13}$C polarization) were obtained as a function of microwave frequency for four synthetic diamond samples with respective $^{13}$C concentrations of 1.1%, 10%, 25%, and 100%. Generally, the strength of the NMR signal can be indicative of the nuclear polarization of the diamond sample, as the nuclear polarization is proportional to the integrated area of the frequency domain NMR signal. NMR signal was observed from the various $^{13}$C concentration samples after accumulating between approximately 20-60 scans with a repetition time of 60 seconds. To measure polarization buildup curves, a series of saturation pulses was applied followed by a variable polarization time and a 90° pulse to acquire the bulk $^{13}$C signal. Natural diamonds typically exhibit an abundance of $^{13}$C of approximately 1.1%. Thus, the diamond samples having $^{13}$C concentrations of 10%, 25%, and 100% represent enhanced concentrations higher than those in naturally occurring diamonds. The 10% $^{13}$C diamond sample was observed to have a significantly higher polarization than the 1.1% $^{13}$C, 25% $^{13}$C, and 100% $^{13}$C samples.

Figure 2:
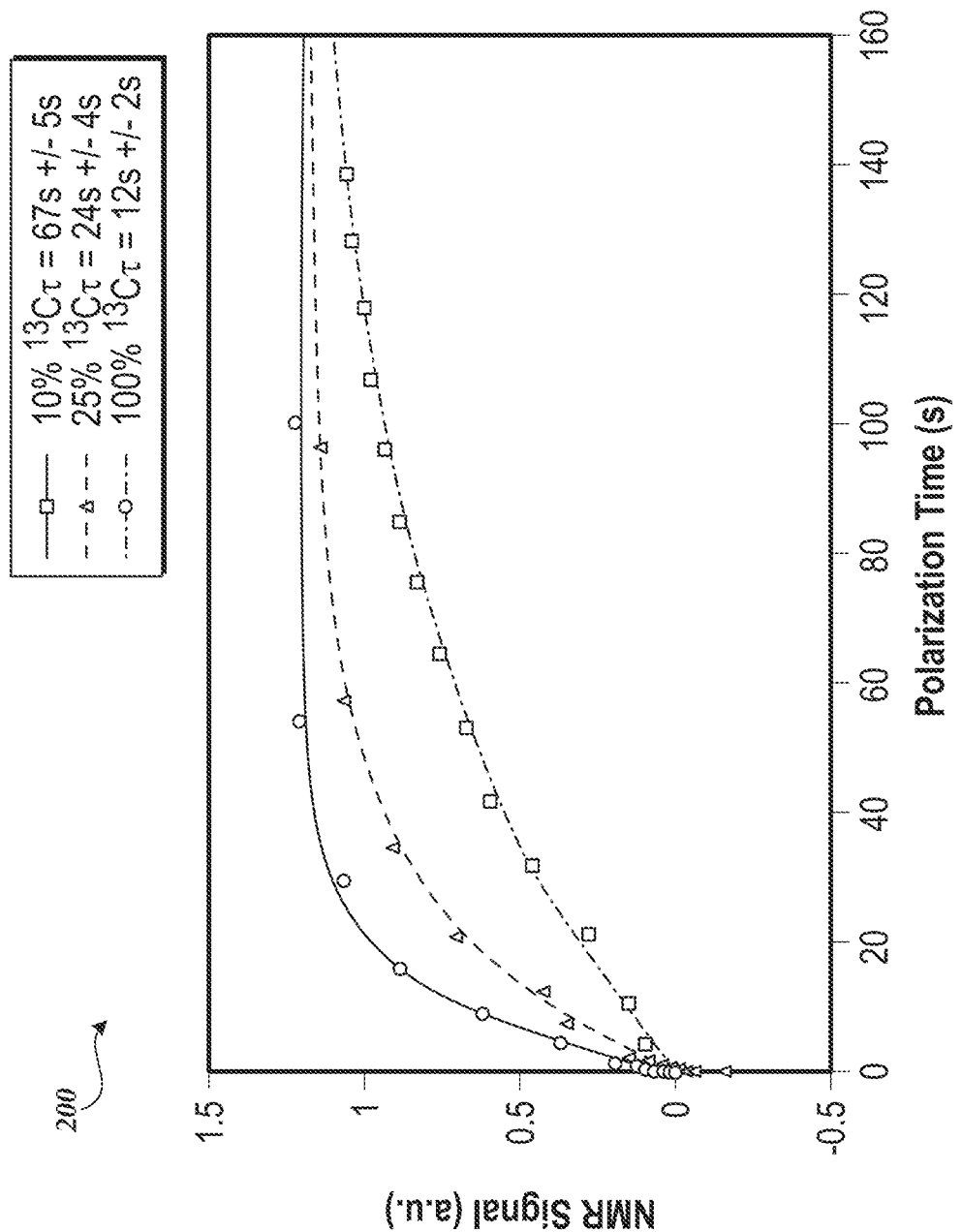
FIG. 2 is a graph depicting the rates of dynamic nuclear polarization buildup of $^{13}C$ enriched diamond materials having $^{13}C$ concentrations of 10%, 25%, and 100%.

The $^{13}$C concentration of a diamond sample may also affect the DNP buildup rate within the sample. FIG. 2 is a graph 200 depicting the relative DNP buildup rates for samples with $^{13}$C concentrations of 10%, 25%, and 100%. Graph 200 shows the strength of an NMR signal obtained from each of the three samples over a duration of 160 seconds under continuous laser and microwave irradiation. The experimental data show that DNP buildup, as indicated by the strength of the NMR signal, is fastest for the 100% $^{13}$C sample, slower in the 25% $^{13}$C sample, and slowest for the 10% $^{13}$C sample. This relationship indicates that spin diffusion may be the rate-limiting factor in polarization transfer from nitrogen vacancy centers to the surrounding $^{13}$C nuclei in the diamond material.

As described herein, transfer of nuclear spin polarization from nitrogen vacancy centers to external nuclei of NMR sample materials may occur indirectly through intermediate coupling with the $^{13}$C nuclei within the diamond. Thus, the proximity of the $^{13}$C nuclei in the diamond to the nuclei of the NMR sample may affect the strength of the indirect coupling between the external nuclei and the nitrogen vacancy centers. Accordingly, where liquid NMR samples are used, enhancements to the surface area of the diamond may allow for better transfer of spin polarization. The surface area of the diamond may be increased by creating pores or forming a variety of microstructures on the surface of the diamond. Microstructures on the diamond may have a variety of shapes, sizes, and configurations. The microstructures may include a regular or irregular pattern. In various embodiments, the spacing of each microstructure can range from 100 nm to 100 µnm, from 500 nm to 10 µm, from 1 µm to 5 µm, and from 2 µm to 4 µm. In various embodiments, the width of each microstructure can range from 10 nm to 1µ, from 50 nm to 800 nm, from 100 nm to 500 nm, and from 200 nm to 400 nm. In one embodiment, the microstructures are in the shape of pillars that may be patterned into the surface of the diamond. Any suitable patterning technique may be used to form the microstructures, including additive or substractive processing techniques. In some embodiments, the patterning is performed using lithographic techniques.

Figure 3:
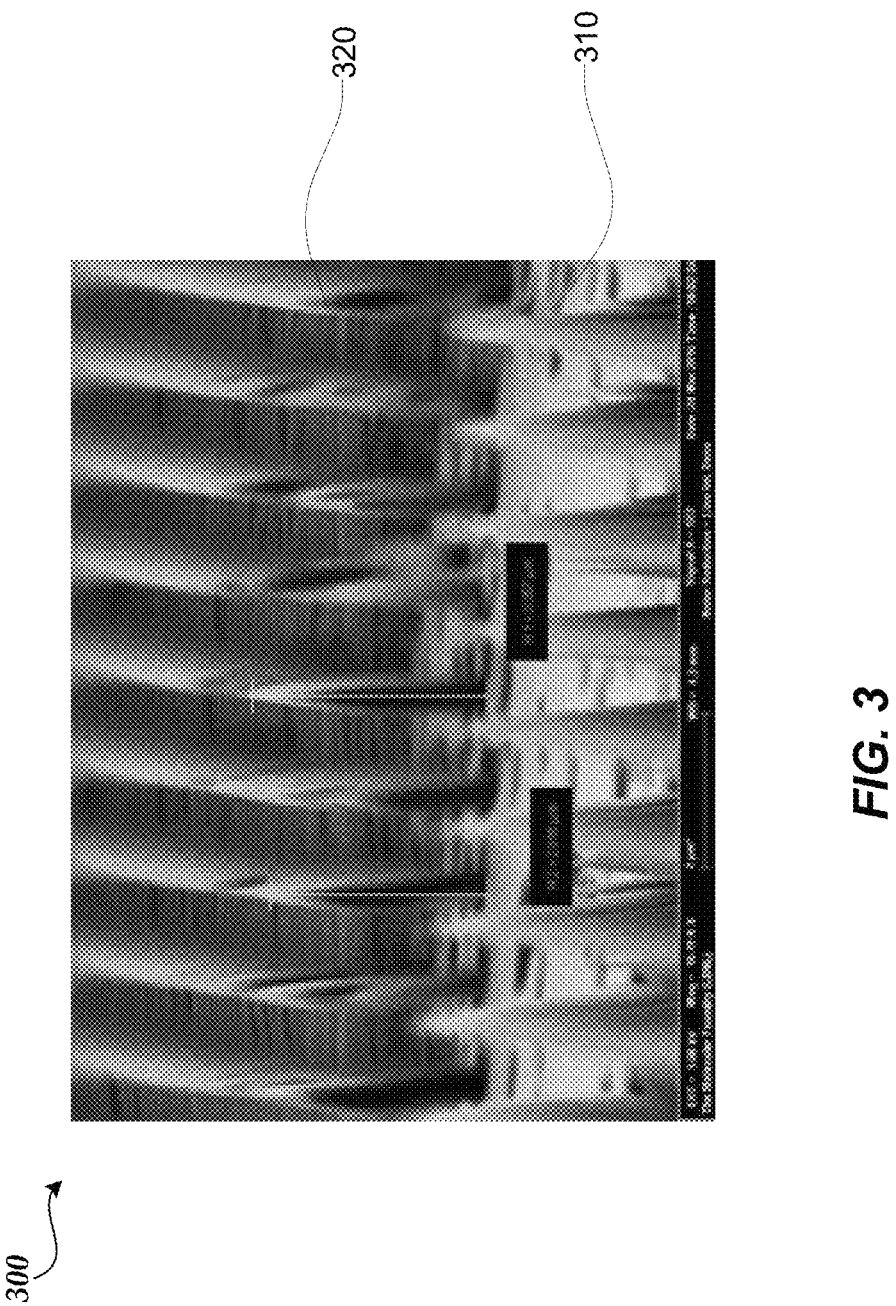
FIG. 3 depicts a surface of a diamond material including an array of pillars in accordance with an exemplary embodiment.

FIG. 3 depicts a diamond surface 300 having an array of pillars 320. The diamond surface 300 shown in FIG. 3 includes a flat surface 310 with a series of pillars 320 comprising the same diamond material. A liquid NMR sample may be permitted to flow along the flat surface 310 and between the pillars 320 so as to expose the NMR sample to a relatively large number of polarized $^{13}$C nuclei. For example, the pillars 320 on the surface 300 may increase the surface area of the diamond by as much as 5 times, 6 times, 6.5 times, or more. Because signal enhancement using the diamond materials described herein can be surface-area limited, such an increase in surface area may result in a corresponding 5-fold, 6-fold, 6.5-fold, or greater enhancement in signal strength. In the example shown, the pillars 320 are approximately 2.8 microns to 3.1 microns in height. Pillars 320 have diameters of approximately 330 nm to 400 nm, and are spaced apart at a pitch of approximately 1.2 microns. It will be appreciated that other pillar configurations with different heights, diameters, and pitches may similarly be utilized without departing from the scope of the present disclosure.

Figure 4G:
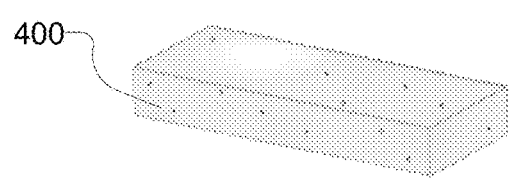
Figure 4G:
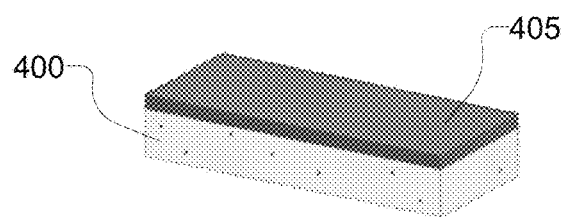
Figure 4G:
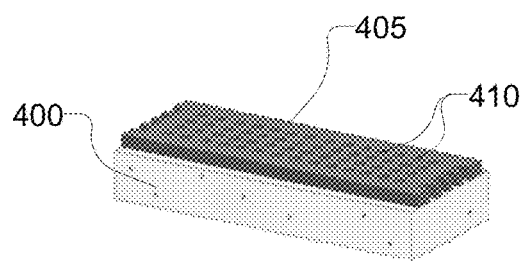
Figure 4G:
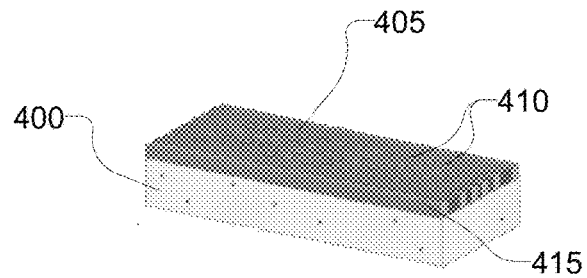
Figure 4G:
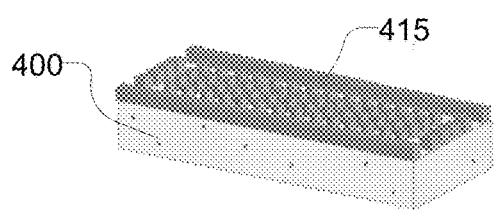
Figure 4G:
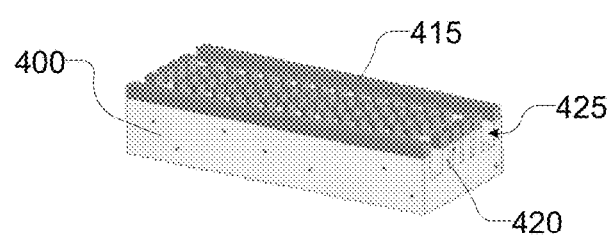
Figure 4G:
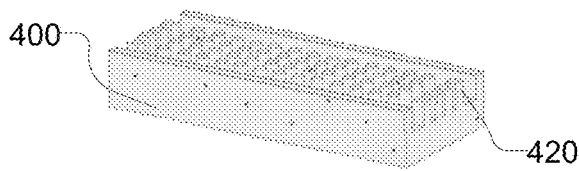

FIGS. 4A-4G depict an example method of fabricating a diamond sample 400 with pillars 420 for enhancement of polarization transfer. For example, the diamond sample 400 can have a surface consistent with the diamond surface 300 depicted in FIG. 3. As shown in FIG. 4A, a diamond sample 400 may be generated, such as by chemical vapor deposition or other diamond synthesis technique. The diamond sample 400 may be a single crystal sample including an ensemble of nitrogen vacancy centers and a desired concentration of $^{13}$C nuclei. In some aspects, the surface to be etched may be cleaned with an acid to enhance the reliability of the fabrication process. As shown in FIG. 4B, the diamond sample 400 may first be coated with a layer 405 of an acrylic material, such as polymethyl methacrylate (PMMA) or the like. In some aspects, the PMMA layer 405 may be a bilayer, and may be applied by spin-coating or other suitable coating technique. After the PMMA layer 405 is applied, layer 405 may be patterned as shown in FIG. 4C to define the locations, sizes, and shapes of the pillars to be generated. For example, electron beam lithography may be used to create circular gaps 410 in the PMMA layer 405 of a desired diameter.

Referring now to FIG. 4D, after circular gaps 410 are created within the PMMA layer 405, a metal 415 may be applied to fill the gaps 410. The metal 415 may be any metal suitable as a diamond etching mask, for example, gold or the like. Metal 415 may be applied by evaporation or other suitable surface coating process. After the metal 415 is applied to the gaps in the PMMA layer 405, the PMMA layer 405 may be lifted off or otherwise removed by a solvent to produce a diamond etching mask as shown in FIG. 4E. The diamond sample 400 may then be etched as shown in FIG. 4F, such as by O$_2$ plasma reactive-ion etching, or other suitable etching methods configured to remove a portion of the surface material of the diamond sample 400 while leaving the etching mask metal 415 intact. By removing only the portion of the surface of the diamond sample 400 uncovered by the metal 415, the etching process creates an array of interstices 425 defining pillars 420. Once the pillars 420 and interstices 425 have been created by etching, the remaining metal 415 can be removed, such as by application of an acid, to yield a diamond sample 400 having an array of pillars 420 as shown in FIG. 4G.

Figure 5:
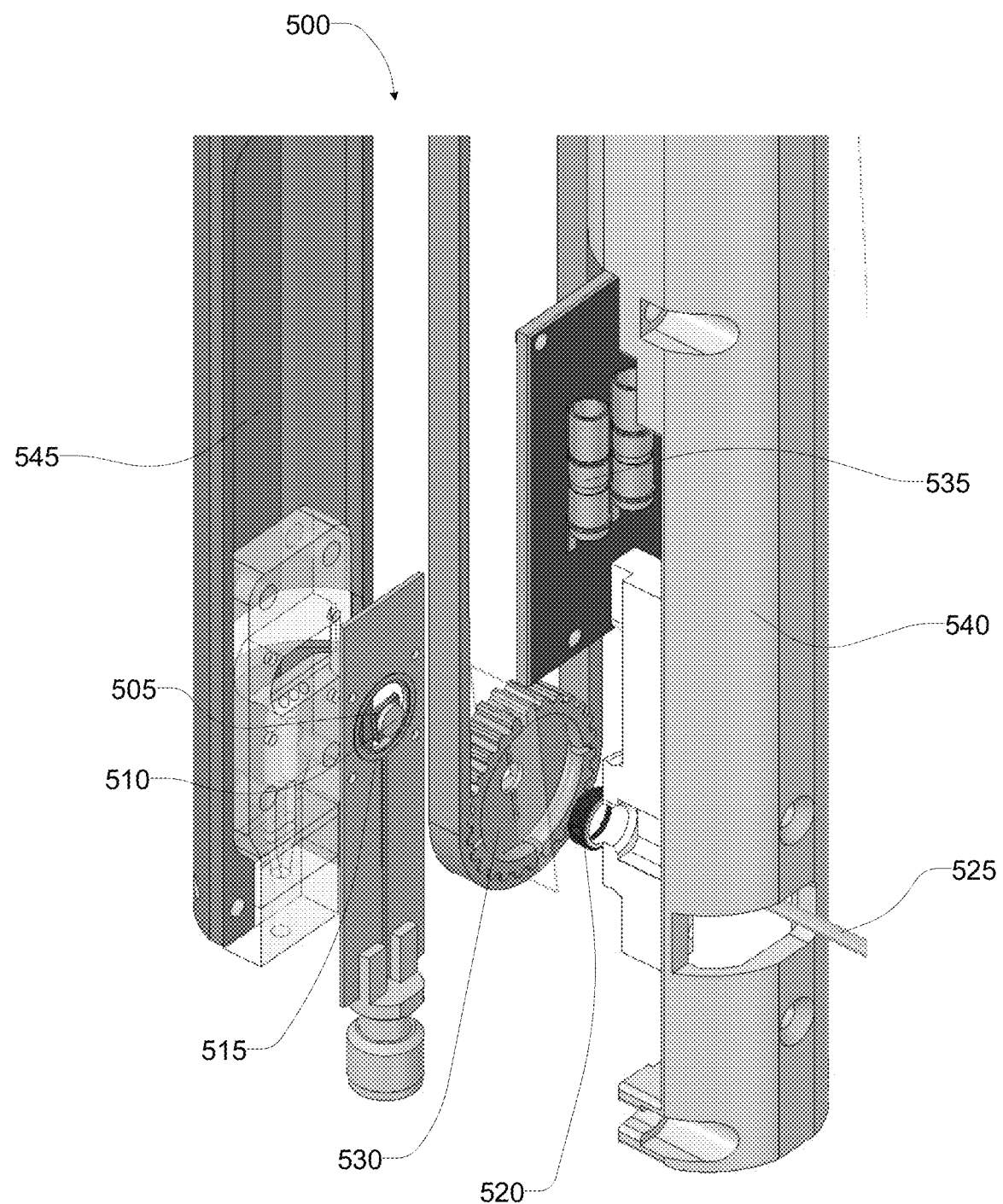
FIG. 5 depicts an example nuclear magnetic resonance spectroscopy system configured to generate an enhanced signal through dynamic nuclear polarization transfer.

With reference to FIG. 5, an example system 500 for obtaining NMR spectra with enhanced signal strength will now be described. Systems may include components typically found in NMR systems as well as optical pumping and microwave irradiation components configured to polarize nitrogen vacancy centers in a diamond sample and transfer the polarization to an NMR sample through DNP. Systems may further include sample holders configured to hold an NMR sample in close proximity to an optically polarized diamond sample. Thus, advantageous features of the system 500 can include the ability to achieve DNP and NMR spectroscopy simultaneously at a common sample location. FIG. 5 depicts the example system 500 in an exploded view. The system 500 includes a diamond sample 505 adjacent to an NMR sample holder 510 configured to hold an NMR sample to be analyzed. The diamond sample 505 and NMR sample holder 510 are located within a broadband microwave loop 515. Laser beam 525 travels through an NMR coil 520 along the linear axis of the coil 520 to irradiate the diamond sample 505. Sample rotation mount 530 can be used to define a user-selected alignment between the NMR sample and the NMR coil 520 or other components. The NMR tuning circuit 535 may be located above the other components. Shielding components 540, 545 surround the apparatus.

Thus, the NMR system 500 depicted in FIG. 5 can be used in accordance with known NMR analysis methods, while containing a diamond sample 505 close to the NMR sample material to transfer polarization as described elsewhere herein from nitrogen vacancy centers within the diamond sample 505 to nuclei within the NMR sample. In some aspects, the diamond sample 505 may be a powder containing diamond crystallites. Diamond crystallites may have diameters ranging, for example, from 500 nm to 100 μm. In other aspects, the diamond sample 505 may be a single crystal. For example, the diamond sample 505 may be a single crystal having an array of pillars on the surface as depicted and described with reference to FIGS. 3-4G. By allowing laser beam 525 to enter the apparatus along the axis of the NMR coil and locating the diamond sample 505 within a microwave loop 515, the diamond sample 505 can be continuously optically pumped and exposed to microwave radiation while NMR spectra are obtained so as to increase or maximize polarization transfer from the diamond sample 505 to the NMR sample for enhanced NMR signal strength. The NMR sample may be a solid or liquid sample in contact with the diamond material 505. In one embodiment of a liquid sample, the liquid may be between the diamond material 505 and a glass slide. The laser beam 525 may then pass through the glass slide and liquid sample to impact and excite the diamond material 505.

Figure 6:
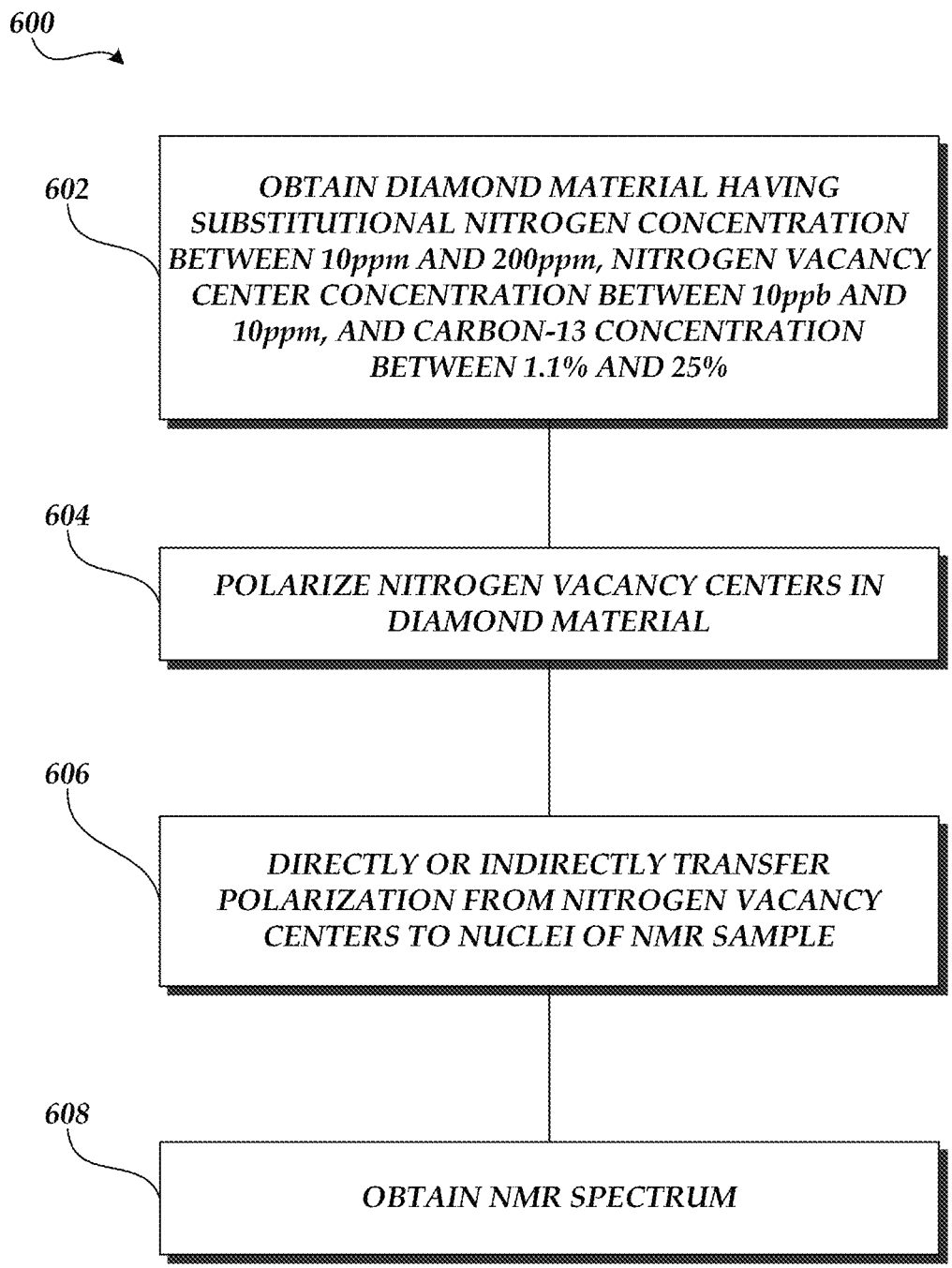
FIG. 6 depicts an example process of generating a nuclear magnetic resonance spectrum with enhanced signal strength.

FIG. 6 depicts an example method 600 of generating an NMR spectrum with enhanced signal strength. Method 600 may be implemented using any of the diamond materials described herein, and may also use the system 500 described with reference to FIG. 5. The method 600 begins at block 602, where a diamond material is obtained. The diamond material may have a substitutional nitrogen concentration between 10 ppm and 200 ppm, a nitrogen vacancy center concentration between 10 ppb and 10 ppm, and a $^{13}C$ concentration between 1.1% and 25%. For example, the nitrogen vacancy concentration may be between 1 ppm and 10 ppm. In some aspects, the $^{13}C$ concentration may be approximately 10%. The diamond material may be generated by chemical vapor deposition using relative concentrations of methane and nitrogen to produce the desired concentrations of substitutional nitrogen, nitrogen vacancy centers, and $^{13}C$. The diamond material may be a single crystal with an enhanced surface (e.g., a surface having an array of pillars) or may include a quantity of small diamond crystallites. After the diamond material is obtained, the method 600 continues to block 604.

At block 604, nitrogen vacancy centers in the diamond material are polarized. Polarization of the nitrogen vacancy centers may include polarizing the electron spins of the nitrogen vacancy centers. Polarization may be achieved through optical pumping, such as by exposure to a beam from a laser source. Polarization of the nitrogen vacancy centers may be accomplished at any suitable temperature, and the process may be temperature-independent. Microwave irradiation and optical pumping may be maintained intermittently or continuously throughout the execution of method 600. After the diamond material is polarized, the method 600 continues to block 606.

At block 606, polarization of the nitrogen vacancy centers is transferred, directly or indirectly, to nuclei in an NMR sample external to the diamond material. Nitrogen vacancy center electron spin polarization may be transferred directly to the NMR sample nuclei, or may be transferred from nitrogen vacancy centers to the $^{13}C$ nuclei in the diamond material, and from the $^{13}C$ nuclei to the NMR sample nuclei. Transfer of polarization may be accomplished, for example, by DNP enabled by microwave irradiation of the diamond and/or NMR sample materials, and may result in hyperpolarization of the $^{13}C$ nuclei and/or NMR sample nuclei. The polarization transfer may be physically facilitated by using a liquid NMR sample and a diamond material with an enhanced surface area (e.g., with pillars or other texturing to increase surface area relative to a flat surface). After hyperpolarization of the NMR sample nuclei occurs through DNP, the method 600 continues to block 608.

At block 608, an NMR spectrum is obtained. Generally, NMR spectra obtained using the method 600 may have a significantly stronger signal than NMR spectra obtained without hyperpolarization from nitrogen vacancy centers in diamond materials. The NMR spectrum may be gathered by known NMR spectroscopy techniques. In some aspects, the method 600 may be implemented with smaller sample sizes than would be useful with other methods. In addition, the method 600 may significantly improve results for NMR sample materials with low gyromagnetic ratios, which are difficult to study with existing techniques.

The embodiments described herein are exemplary. Modifications, rearrangements, substitute processes, etc. may be made to these embodiments and still be encompassed within the teachings set forth herein. Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently rather than sequentially.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements, and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B, and C" can include a first processor configured to carry out recitation A in conjunction with a second processor configured to carry out recitations B and C.

While the above detailed description has shown, described, and pointed out novel features as applied to illustrative embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A polarizable diamond material for transfer of nuclear spin polarization comprising $^{12}C$, $^{13}C$, substitutional nitrogen, and nitrogen vacancy defects in a $^{13}C$, crystalline lattice, the polarizable diamond material comprising a diamond crystallite powder comprising crystallites having a diameter between 500 nm and 100 μm;
   wherein a substitutional nitrogen concentration in the polarizable diamond material is between 10 ppm and 100 ppm;
   wherein a nitrogen vacancy concentration in the polarizable diamond material is between 10 ppb and 10 ppm; and
   wherein a $^{13}C$ concentration in the polarizable diamond material is greater than 1.1% and not more than 25%.

2. The polarizable diamond material of claim 1, wherein the $^{13}C$ concentration in the diamond material is between 8% and 12%.

3. The polarizable diamond material of claim 1, wherein the nitrogen vacancy concentration in the diamond material is between 1 ppm and 10 ppm.

4. A method of obtaining a nuclear magnetic resonance spectrum of a sample, the method comprising:
   optically pumping a polarizable diamond material to generate electron spin hyperpolarization in nitrogen vacancies within the polarizable diamond material, wherein the polarizable diamond material comprises $^{12}C$, $^{13}C$, substitutional nitrogen, and nitrogen vacancy defects in a crystalline lattice and has a substitutional nitrogen concentration between 10 ppm and 100 ppm, a nitrogen vacancy concentration between 10 ppb and 10 ppm, and a $^{13}C$ concentration greater than 1.1% and not more than 25%, the polarizable diamond material comprising a diamond crystallite powder comprising crystallites having a diameter between 500 nm and 100 μm;
   transferring the electron spin hyperpolarization directly or indirectly to nuclei of the sample external to the polarizable diamond material; and
   generating a nuclear magnetic resonance spectrum by applying a magnetic field to the sample, exciting the sample with a radio frequency pulse, and detecting a nuclear magnetic resonance response from the sample.

5. The method of claim 4, wherein the $^{13}C$ concentration in the polarizable diamond material is between 8% and 12%.

6. The method of claim 4, wherein the nitrogen vacancy concentration in the polarizable diamond material is between 1 ppm and 10 ppm.

7. The method of claim 4, wherein the sample comprises a solid having at least a first face, and wherein transferring the electron spin hyperpolarization to nuclei of the sample comprises placing at least some of the crystallites against the first face of the solid.

* * * * *

UNITED STATES PATENT AND TRADEMARK OFFICE
CERTIFICATE OF CORRECTION

PATENT NO. : 10,983,184 B2
APPLICATION NO. : 15/850392
DATED : April 20, 2021
INVENTOR(S) : Anna Parker Page 1 of 1

It is certified that error appears in the above-identified patent and that said Letters Patent is hereby corrected as shown below:

In the Specification

In Column 6, Line 3, delete "μnm," and insert --μm,--.

In Column 6, Line 3, delete "μnm," and insert --μm,--.

In the Claims

In Column 10, Claim 1, Line 6, delete "$^{13}$C, crystalline" and insert --crystalline--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*